United States Patent [19]

Bodeep et al.

[11] Patent Number: 5,020,049
[45] Date of Patent: May 28, 1991

[54] OPTICAL SUB-CARRIER MULTIPLEX TELEVISION TRANSMISSION SYSTEM USING A LINEAR LASER DIODE

[75] Inventors: George E. Bodeep, Point Pleasant; Thomas E. Darcie, Middletown; Edward J. Flynn, Summit, all of N.J.; Jan Lipson, Breinigsville, Pa.; Carl J. McGrath, Atkinson, N.H.; Charles B. Roxlo, Bridgewater, N.J.; Mark S. Schaefer, Salem, N.H.; L. C. Upadhyayula, Macungie Township, Lehigh County, Pa.

[73] Assignee: AT&T Bell Laboratories, Murray Hill, N.J.

[21] Appl. No.: 420,849

[22] Filed: Oct. 13, 1989

[51] Int. Cl.$^5$ .............................................. H04J 1/00
[52] U.S. Cl. .......................................... 370/3; 370/1; 455/609; 455/611; 455/618
[58] Field of Search ............... 455/609, 610, 611, 618; 370/3, 1, 57; 372/29, 31, 32

[56] References Cited

U.S. PATENT DOCUMENTS

| | | | |
|---|---|---|---|
| 4,101,847 | 7/1978 | Albanese | 372/31 |
| 4,601,027 | 7/1986 | Scarr et al. | 370/3 |
| 4,722,081 | 1/1988 | Fujito et al. | 370/3 |
| 4,768,186 | 8/1988 | Bodell | 370/3 |
| 4,893,300 | 1/1990 | Carlin et al. | 370/3 |
| 4,953,156 | 8/1990 | Olshansky et al. | 370/3 |

FOREIGN PATENT DOCUMENTS

| | | | |
|---|---|---|---|
| 0319242 | 6/1989 | European Pat. Off. | 370/3 |
| 2559630 | 8/1985 | France | 370/3 |

OTHER PUBLICATIONS

T. E. Darcie et al., "Lightwave Multi-Channel Analog AM Video Distribution Systems", *ICC*, Jun. 1989, pp. 1004–1007.

T. E. Darcie et al., "Intermodulation and Harmonic Distortion in InGaAsP Lasers", *Electronic Letters*, Aug. 1985, vol. 21, No. 16, pp. 665–666; erratum, *Electronic Letters*, May 1986, vol. 22, No. 11, p. 619.

J. Milo et al., "InGaAsP Double-Channel–Planar-Buried–Heterostructure Laser Diode (DC–DBH LD) With Effective Current Confinement", *Journal of Lightwave Technology*, vol. LT-1, Mar. 1983, pp. 195–202.

*Primary Examiner*—Reinhard J. Eisenzopf
*Assistant Examiner*—Kinfe-Michael Negash
*Attorney, Agent, or Firm*—Richard B. Havill; Gregory C. Ranieri

[57] ABSTRACT

An amplitude-modulated vestigial-sideband, television channel sub-carrier multiplexed optical fiber transmission system includes a laser diode operating linearly throughout the desired range of multiplex frequencies. Such linear laser diode operation is accomplished by limiting leakage current within the laser diode to a very low level. The composite second-order distortion in the optical output signal from the laser diode is down typically 50 db from the video carrier for each channel. For some laser diodes that exhibit slow turn-on in the L-I characteristic, there is a point of inflection in the L-I curve. Operation with the laser biased at or near this point results in extremely linear performance, even though the laser may have insufficient blocking of leakage current to otherwise produce acceptable linearity.

6 Claims, 7 Drawing Sheets

OPTICAL SUB-CARRIER MULTIPLEX TELEVISION TRANSMISSION SYSTEM USING A LINEAR LASER DIODE

TECHNICAL FIELD

The invention relates to an optical link for transmitting multichannel frequency division multiplexed television channel signals.

BACKGROUND OF THE INVENTION

The concept of transmitting several television channels over a single-mode optical fiber via analog intensity modulation of a semiconductor laser diode has been receiving considerable attention. As proposed in the prior art, an arrangement would transmit multi-channel amplitude modulated-vestigial side-band (AM-VSB) signals, as used in present day cable television (CATV) systems, in an optical fiber transmission media. Such an arrangement would be useful in a CATV trunk system or in a fiber-to-the-home network. Optical fiber transmission systems that use the frequency division multiplexed AM-VSB format deliver a signal that is compatible with present day television and VCR equipment. They also have advantages such as simplicity of design, reduced bandwidth requirements for lightwave components, and much lower costs than digital or frequency-modulated alternatives.

The low loss of optical fibers make analog sub-carrier modulation an attractive technology. Several signals at different sub-carrier frequencies, each signal representing one of the television channels to be multiplexed, are summed and applied concurrently to the input of the laser device. The resulting laser drive current is a dc bias level plus the set of AM-VSB sub-carrier signals. For the laser, the magnitude of the optical output power from the laser is an approximately linear function of its drive current. The resulting sub-carrier frequency division multiplexed (FDM) output signal is applied to an optical fiber for transmission over an extended distance.

Multi-channel AM-VSB signal transmission requires special restrictions on the power, the linearity, and the intensity noise of the transmitting laser diode. For adequate system performance, the laser output light intensity must be a linear function of its drive current. Strict limitations on laser diode linearity are required because of the wide dynamic range of the National Television Systems Committee (NTSC) standard video format. Lasers with fairly linear characteristics are available with composite second and third harmonic distortion down to −30 dBc and −40 dBc, respectively, from the relevant carrier fundamental for acceptable levels of input modulation current. In that NTSC standard video format, the ratio of the magnitude of the total composite of the third order intermodulation distortion products at the carrier frequency to the magnitude of the carrier must be less than approximately −60 dBc. Similarly, the peak second-order distortion, i.e., the sum of several tens of two-tone products (or the ratio of the largest composite second-order peak to the carrier), must be less than approximately −50 dBc. This low distortion must be obtained when the laser is modulated with an optical modulation depth of typically one percent–ten percent per channel, to insure acceptable carrier-to-noise performance. To obtain such high signal quality in view of the large number of distortion products, the transmitting laser light power versus drive current characteristic curve must be extremely linear.

The two-tone third-order intermodulation distortion and the second harmonic distortion, respectively, must be near 96 dB and 70 dB lower than the video carrier, or better, for each channel.

Frequency division multiplexed signals generate intermodulation distortion because of any nonlinearity in the laser diode light versus current (L-I) characteristic. In frequency division multiplexed optical fiber systems, second-order laser nonlinearities create energy transfers from the applied sub-carrier frequencies to the sum and difference frequencies of all of the pairs of the applied signal frequencies. Third-order nonlinearities generate distortion products at frequencies corresponding to combinations of three applied signals. Such energy transfers cause undesirable intermodulation distortion and interference, both of which can limit the performance of the transmission system. There are several known causes of nonlinearity in semiconductor laser diodes. Some of the causes of nonlinearity are high frequency relaxation oscillations, low frequency heating effects, damping mechanisms, such as gain compression and nonlinear absorption, and leakage current. The resulting effect of the distortion is interference in the signal received further along in the system.

Although the most attractive architecture for multiplexing multiple video channels onto a continuous-wave laser output is by way of amplitude modulated-vestigial sideband signal multiplexing, the previously available semiconductor lasers exhibit distortions that fall short of meeting the strict linearity requirements for multi-channel frequency division multiplexing of television signals for CATV systems within the desired range of multiplex frequencies. Thus prior art multiplex systems cannot effectively perform the desired multiplexing operation. The problem is to develop a system with a sufficiently linear semiconductor laser diode so that the laser diode limits undesirable intermodulation distortion to an acceptable level when that diode is driven by a frequency division multiplexed group of television signal channels.

SUMMARY OF THE INVENTION

This problem is solved by a sub-carrier multiplexed transmission system wherein a plurality of television channels are frequency division multiplexed and combined with a dc bias current for driving a laser diode. The laser diode operates linearly throughout the desired range of multiplexed frequencies. Such linear laser diode operation is accomplished by limiting leakage current within the laser diode to a very low level. The composite second-order distortion in the optical output signal from the laser diode is down typically 50 dB from the video carrier for each channel, while maintaining approximately a 50 dB carrier-to-noise ratio.

For analog multiplexing of television channels on an optical carrier, laser diode linearity and low leakage current are far more important than device speed. The importance of low leakage current in achieving high linearity laser diodes is not yet understood by other device and system designers. A low leakage laser diode can provide acceptable linearity even though that device has a much narrower bandwidth than is required for high speed digital transmission systems. Reaching an understanding of how critical low laser leakage current is to achieving acceptably high linearity in a laser diode to be used in an amplitude modulated-vestigial sideband signal sub-carrier multiplexed optical fiber transmission system is a major discovery in the development of an efficient optical fiber CATV system.

For laser diodes that exhibit slow turn-on in the L-I characteristic, there is a point of inflection in the L-I curve. Operation with the laser biased at this point results in extremely linear performance, even though the laser may have insufficient blocking of leakage current to otherwise produce acceptable linearity.

BRIEF DESCRIPTION OF THE DRAWING

A more complete understanding of the invention may be derived by reading the subsequent detailed description when that description is read with reference to the drawing wherein.

DETAILED DESCRIPTION

Figure 1:
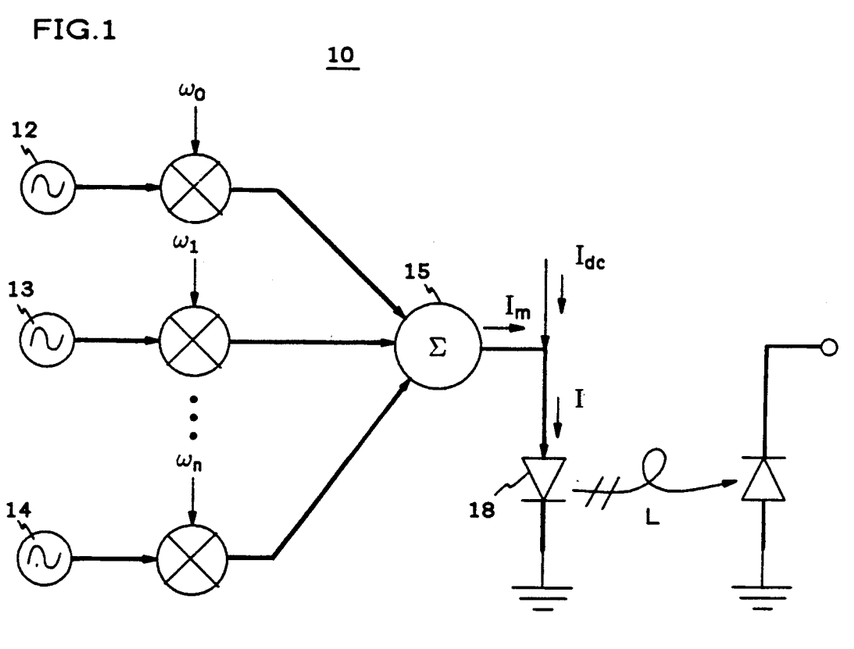
FIG. 1 is a block diagram of a sub-carrier multiplexed optical communication system.

Referring now to FIG. 1, there is shown an amplitude modulated-vestigial sideband sub-carrier multiplexed optical transmission system 10. Several baseband frequency modulation television channels 12, 13 and 14 are frequency division multiplexed on different carrier frequencies $\omega_0$, $\omega_1$ and $\omega_2$, as separate amplitude modulated-vestigial sideband sub-carriers, in a multiplexed input $I_m$ signal. A summer 15 combines the individual television channels at the different sub-carrier frequencies into the multiplexed input signal $I_m$ without distortion. This multiplexed input signal $I_m$ is applied to a laser diode 18 as a part of a total laser drive current I.

The total laser drive current, or injection current, I to the laser diode 18 includes both a dc bias current $I_{dc}$ and the composite multiplexed input signal $I_m$ from the summer 15. The number of channel signals in the laser drive current may be as many as eighty or more bands of frequencies throughout a range of frequencies from 1 MHz to 1 GHz. For a perfectly linear laser, its output optical signal power L varies directly with the magnitude of the applied laser drive current.

Figure 2:
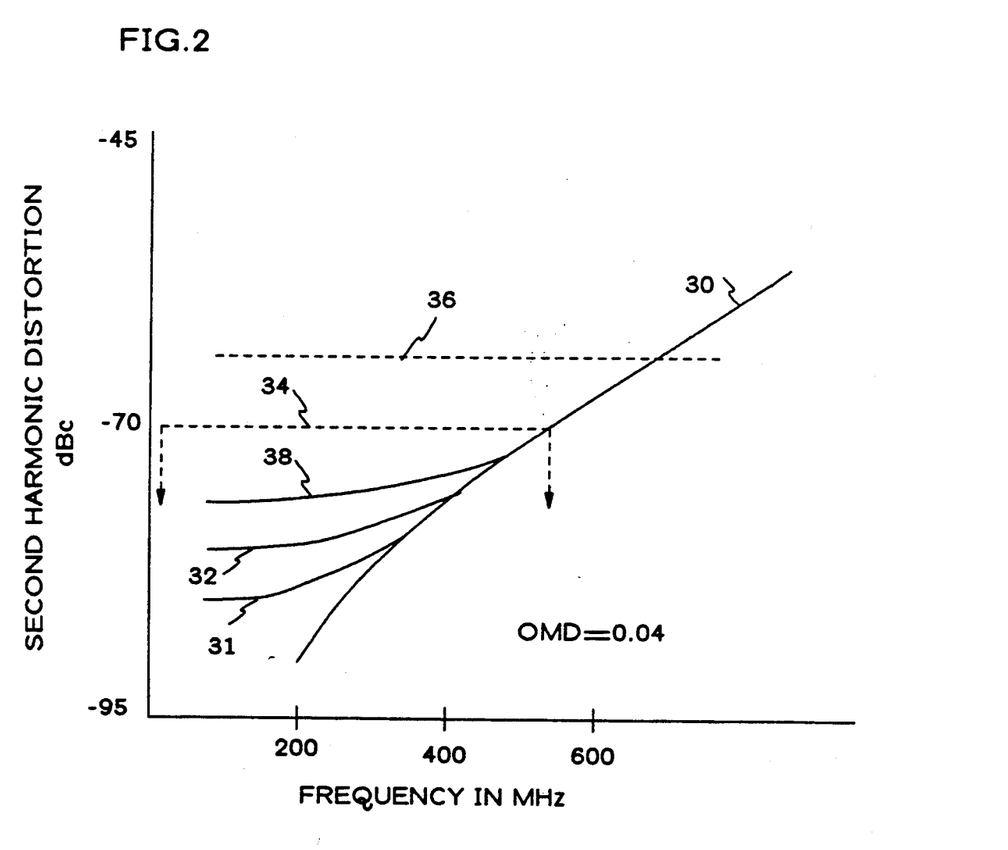
FIG. 2 is a graph showing various distortion signals in the output from a sub-carrier multiplex system using a laser diode.

Referring now to FIG. 2, there is shown a plot 30 of a second harmonic distortion level versus frequency curve for a typical laser diode. Superimposed onto the lower left portion of that curve are a nonlinear gain curve segment 31 and a nonlinear loss curve segment 32.

Overlaid, between approximately 10 MHz and 550 MHz, on the second harmonic distortion versus frequency curve is a typical distortion objective line 34 for a multichannel frequency division multiplexed television signal. We realize that by employing a laser diode which produces less than approximately −70 dBc second harmonic distortion, with correspondingly small third-order distortion, we can design an optical multiplex arrangement that will effectively frequency division multiplex many television channels into a composite waveform for transmission through an optical fiber.

Above the distortion objective line 34 in FIG. 2, there is a sublinearity line 36 which represents the second harmonic distortion performance of prior art laser diodes. It is noted that this level of distortion, which represents good prior art laser diode operation, fails to meet the distortion objective of −70 dBc that must be met for any practical amplitude-modulated vestigial-sideband frequency-division multiplex arrangement to be used in a CATV trunk system or in a fiber-to-the-home network. Generally, the distortion can always be reduced by reducing the optical modulation depth (m) or the amount of radio frequency power into the laser. However, reducing modulation depth reduces the carrier-to-noise ratio (CNR) of the received signal. The CNR improves as $m^2$ (ref. T. E. Darcie, G. E. Bodeep, Conference Record ICC '89, June 11–14, 1989, pp. 1004–1007), and second-order and third-order distortion increase as $m^2$ and $m^4$, respectively, (ref. T. E. Darcie et al., Electron Lett., Vol. 21, No. 16, pp. 665–666, 1985; erratum Electronic Letters, Vol. 22, No. 11, p. 619, May 1986). Those references are incorporated herein by reference. Since the modulation depth must be typically one percent–ten percent to achieve the required CNR (e.g., approximately 50 dB), one cannot reduce distortion by reducing the modulation depth.

A suitably linear laser diode, on the other hand, will produce a second harmonic distortion curve 38 that meets or exceeds the distortion objective line 34 and can be used to successfully frequency division multiplex many television channels into a single composite signal without objectionable second-order distortion.

We realize that for an extended period of time laser developers have concentrated on making lasers operate faster and faster to handle higher and higher bit rates in digital systems. The resulting lasers have been faster but not more linear because achieving greater linearity has been of secondary importance. For frequency multiplexing many television channels onto an optical fiber, on the other hand, we have pursued an understanding that laser device linearity is far more important than speed of operation.

The problem is to develop and operate a new laser diode that produces distortion below the distortion objective line 34, shown in FIG. 2. For laser diodes, the dominant nonlinear mechanism within the lightwave cable television frequency band has not been identified previously. From prior art disclosures, we know that high frequency relaxation oscillation distortion and low frequency heating effect distortion do not substantially effect linearity in the frequency band for lightwave cable television systems.

Recently we discovered that laser diodes can be designed to operate with sufficient linearity in the required frequency band by reducing their leakage current to a very low level. Such a reduction of laser diode leakage current to a very low level enables the laser diode to operate with sufficient linearity to reduce distortion below the objective because leakage current is the dominant nonlinear mechanism within the frequency band of lightwave cable television systems. A method for producing suitable low leakage semiconductor laser diodes is disclosed in U.S. patent application Ser. No. 420,867 filed in the names of E. J. Flynn, C. J. McGrath, P. M. Nitzsche, and C. B. Roxlo concurrently with this application. Such other patent application is incorporated herein by reference. Laser chips are screened on the basis of their linearity. A discussion of the criteria for the linearity of the laser diodes follows.

Figure 3:
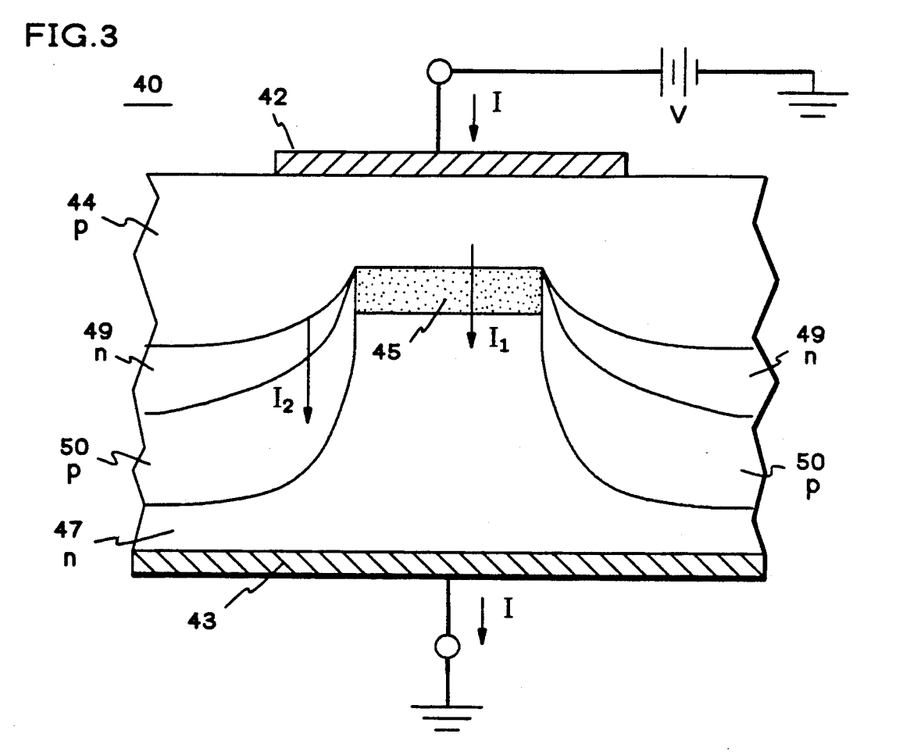
FIG. 3 is a structural and schematic diagram of a laser diode arranged to limit leakage current.

Referring now to FIG. 3, there is shown a cross section of either an etched-mesa buried-heterostructure (EMBH) or double-channel planar-buried-heterostructure (DCPBH) laser diode 40 which is designed to limit leakage current to a very low level. The laser diode 40 includes metallic contacts 42 and 43. A p-type embedding layer 44 spans the entire laser diode. An active layer 45 is positioned on top of a stripe mesa of n-type substrate 47. An n-type current confining layer 49 and a p-type current blocking layer 50 are formed adjacent to and on both sides of the mesa.

During operation the total laser drive current I is conducted into and out of the device by way of leads connected to the metallic contacts 42 and 43. Illustratively the operating voltage across the laser diode 40 is shown as a supply voltage V connected between ground and the metallic contact 42. Contact 43 is connected with ground. Current $I_1$ represents all of the current conducted through the active layer 45. Leakage current $I_2$ is limited by confining most of the total drive current I to the active region via a p-n-p-n structure on both sides of the active-stripe mesa. This structure has been described previously in an article by I. Mito et al., *Journal of Lightwave Technology*, Vol. LT-1, Mar. 1983, pages 195–202, which is incorporated herein by reference. As a result of this advantageous structure, the diode 40 operates with sufficient linearity to keep distortion below the distortion objective line 34 of FIG. 2 in the frequency band for multiplexing many television channels onto a lightwave carrier. Second harmonic distortion is no more than −75 dBc and may be considerably lower.

Although we have just stated that linearity is enhanced sufficiently by limiting leakage current to a low level, such a conclusion is based upon an assumption made from the known factors which affect the linearity of the laser diode 40. The assumption is that leakage current is the principal factor causing sub-linearity in the laser diode 40 when it is used in the frequency and power ranges, required for frequency multiplexing, analog television channels onto an optical carrier. This assumption enables us to create a circuit model which can be analyzed to better understand the operating behavior of the laser diode 40. By comparing the result of an analysis of our model with measured data from actual devices, we have learned that the circuit model accurately predicts the measured data and that our assumption is correct. We concluded that leakage current is the principal factor causing sub-linearity in the laser diode 40 when it is used in the frequency and power ranges, required for frequency multiplexing many television channels onto an optical carrier.

Figure 4:
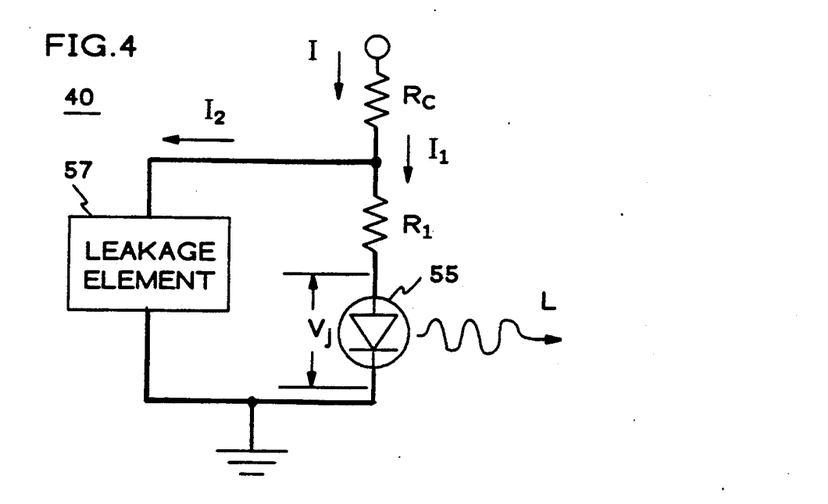
FIG. 4 is a schematic diagram of a model of a laser diode operating in the system of FIG. 1.

Referring now to FIG. 4, there is shown the circuit model which represents the operation of the laser diode 40 of FIG. 3 for the range of drive currents of interest for multiplexing several television channels together. In FIG. 4, a resistor $R_c$ represents a contact resistance, which is the equivalent resistance located in a region between the metallic contact 42 and a part of the p-type material 44 in FIG. 3. In FIG. 4 a resistor $R_1$, represents the resistance in the p-type material 44 just above the active layer 45. A diode symbol 55 represents the operative active layer 45.

A branch of the circuit model represents leakage current operation. In that branch, a leakage current element 57 and the circuit path therethrough represent the actual functions of the leakage current $I_2$ in the laser diode 40 of FIG. 3. As shown in FIG. 3, the corresponding region in the device structure includes those parts of the n-type and p-type layers 44 and 50, which are positioned adjacent to and on both sides of the mesa.

As shown in FIGS. 3 and 4, total laser drive current I is conducted in a path through the contact resistance $R_c$ of the metallic contact 42 and part of the p-type embedding layer 44. Total laser drive current I divides into the active layer current $I_1$ and the leakage current $I_2$, which represents all of the laser drive current I not conducted through the active layer 45 of FIG. 3.

At and above laser threshold, the voltage drop $V_j$ across the active layer has an essentially constant value. Therefore the total voltage across the device can be written $$V = V_j + I_1 R_1 + IR_c \qquad (1)$$

Light L, emitted by the active layer 45, is related to the active layer current $I_1$ as follows:

$$L = L_o'(I_1 - I_1^{th}), \qquad (2)$$

where $L_o'$ is the intrinsic efficiency of the laser heterojunction and $I_1^{th}$ is the value of the active layer current $I_1$ at laser threshold. Using Eq. (2) we can re-write Eq. (1) as $$\begin{aligned} V &= V_j + (I_1 - I_1^{th}) R_1 + I_1^{th} R_1 + IR_c \\ &= V_j + I_1^{th} R_1 + \frac{L}{L_o'} R_1 + IR_c \end{aligned} \qquad (3)$$

By taking the first derivative of Eq. (3) with respect to the total drive current I, we obtain $$\frac{dV}{dI} = \frac{dL}{dI} \cdot \frac{R_1}{L_o'} + R_c \qquad (4)$$

According to equation (4), there exists a linear relationship between the voltage derivative dV/dI and the light power derivative dL/dI.

Figure 5:
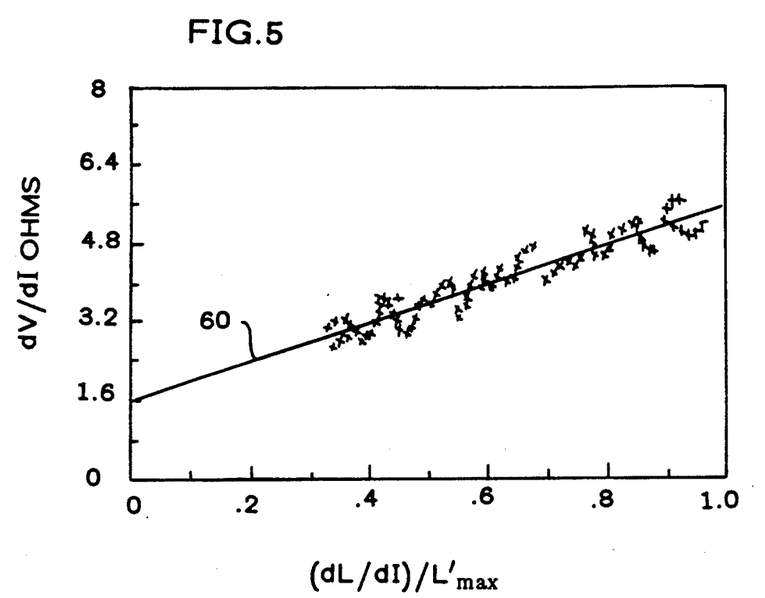
FIG. 5 is a scatter plot of values of data points taken from operating laser diodes.

Referring now to FIG. 5, there is shown a plot of the voltage derivative dV/dI versus the light power dL/dI using measured data from actual devices like the laser diode 40 of FIG. 3. The value of the resistance $R_c$ is the dV/dI axis intercept of a straight-line least-squares plot 60 through the data points. The slope of the straight-line plot 60 will be $R_1 (L_{max}'/L_o')$. In FIG. 5, the values of the light power derivative dL/dI have been normalized by the measured maximum value of dL/dI, denoted by $L_{max}'$. The "dots" in FIG. 5 are actual data points, wherein each data point is evaluated for the voltage and light power derivatives for the same value of the total laser drive current I. The intercept of the solid line on the dV/dI axis reveals the value of the resistance $R_c$, and the slope of the line is equal to $R_1 (L_{max}'/L_o')$.

The foregoing analysis shows that real devices behave according to the equivalent circuit of FIG. 4. The demonstration of this lies in the agreement of the linear dV/dI versus dL/dI prediction of Eq. (4) and the linear plot 60 of FIG. 5. Both dV/dI and dL/dI decrease as the total current I increases in such a way that the straight line plot of FIG. 5 results. The reason for this behavior is that the leakage current - a shunt path through the leakage circuit element of FIG. 4 - is responsible for all of the decrease in the voltage derivative dV/dI and in the light power derivative dL/dI. No other cause needs to be invoked to explain the sub-linear light output power versus total laser drive current characteristic and the sub-linear voltage versus total laser drive current characteristic.

Figure 6:
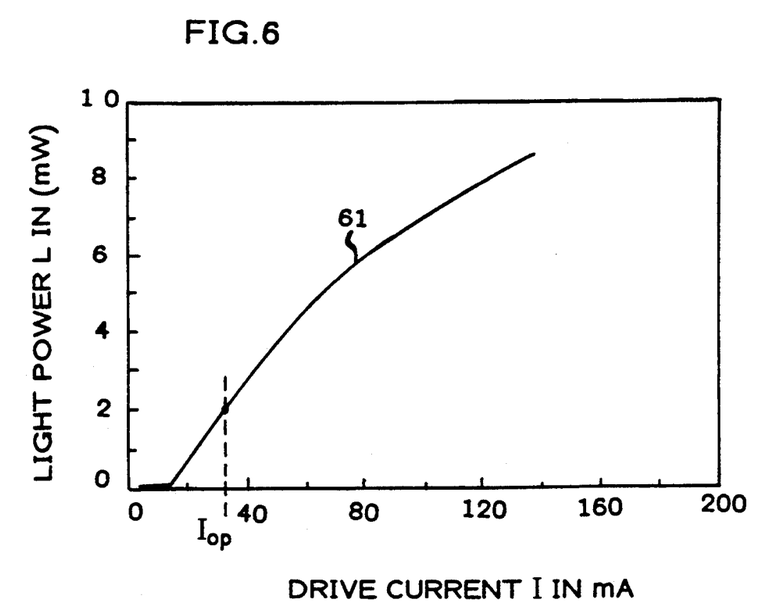
FIG. 6 is a light power versus total drive current characteristic curve for an operating low leakage laser diode.
Figure 7:
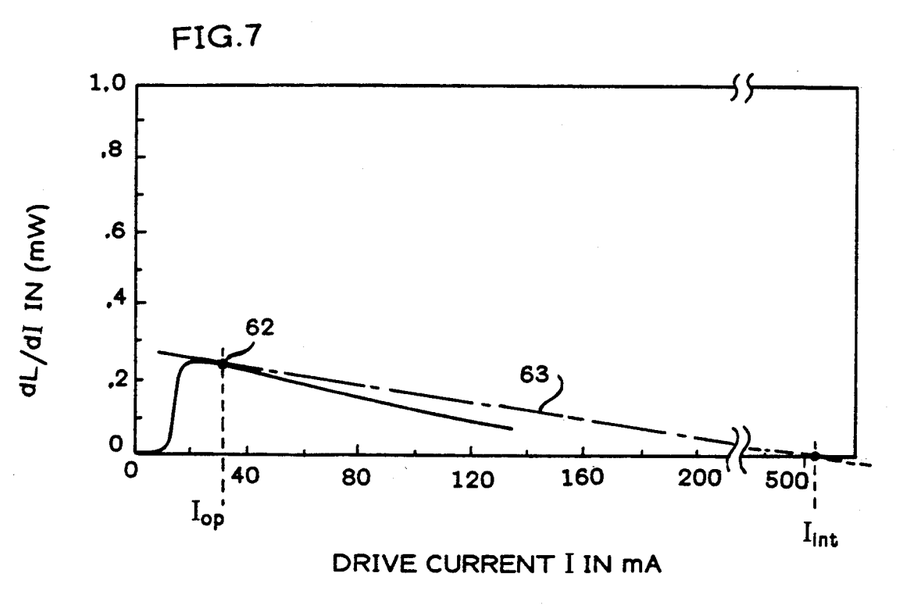
FIG. 7 is a derivative curve for the characteristic curve of FIG. 6.
Figure 8:
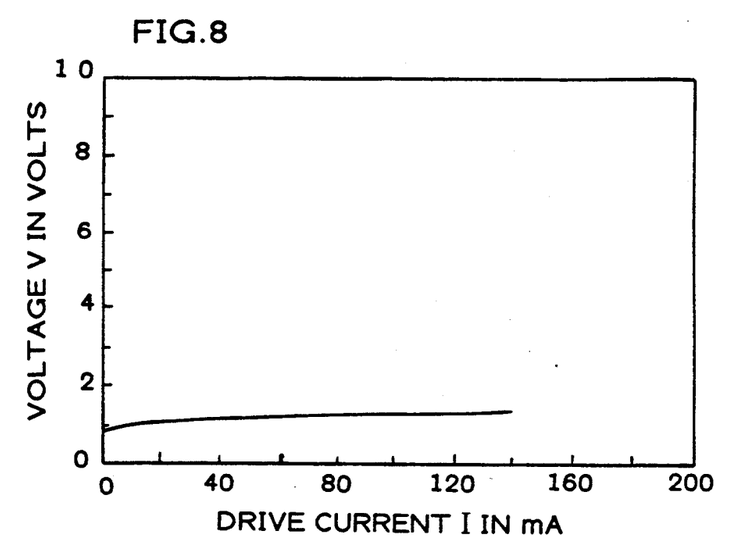
FIG. 8 is a junction voltage versus drive current characteristic curve for an operating low leakage laser diode.
Figure 9:
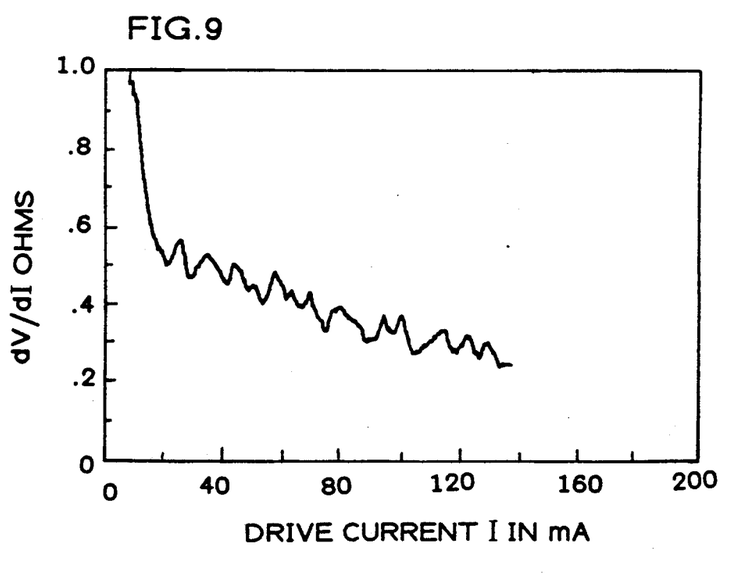
FIG. 9 is a derivative curve for the characteristic curve of FIG. 8.

Entirely consistent with the foregoing analysis of the circuit model is the actual data taken from operating laser diodes. See, for example, FIGS. 6 through 9. FIG. 6 is a plot 61 of laser light power L versus the total laser drive current I characteristic curve for the laser diode 40 of FIG. 3, as determined by a data analyzer and plotter testing an operating laser diode. FIG. 7 shows the light power derivative dL/dI for the data that is plotted in FIG. 6. FIG. 8 is a plot of the voltage V versus the total laser drive current I characteristic curve for the laser diode 40 of FIG. 3. FIG. 9 presents the voltage derivative dV/dI for data used to derive the characteristic curve of FIG. 8. The same analyzer and plotter determines points of the voltage derivative dV/dI and of the light power derivative dL/dI for each value of total drive current I. Those points are plotted on dV/dI versus dL/dI axes in FIG. 5. A least squares fit through those points provides a straight line which is the same as the straight line 60 which is predicted by the assumed circuit model. Thus for purposes of analyzing the effect of leakage current, the circuit model of FIG. 4 is equivalent to the actual devices which were operated and analyzed.

Now by reference to the light power derivative dL/dI curve of any actual laser device otherwise suitable for operation in a frequency-division-multiplexed television channel transmission system, we can readily determine whether or not any selected laser diode will operate with sufficient linearity. We simply plot on FIG. 7 the selected operating point 62. Construct a slope line 63 tangent to the light derivative dL/dI curve at the selected operating point 62. Extend the slope line 63 to the total drive current I axis to determine an intercept drive current $I_{int}$. Determine the difference between the device threshold current $I^{th}$ and the intercept drive current $I_{int}$. By measuring second harmonic distortion and 2-tone third-order distortion of many devices and sorting those out to meet the −70 dBc and −96 dBc requirements, we learned that those devices which have a difference between the device threshold current $I^{th}$ and the intercept drive current $I_{int}$ of at least 500 mA also have low enough leakage current and sufficient linearity for performing the desired multiple television channel multiplexing onto an optical carrier. Having a difference of 500 mA can be converted to a slope of the tangent line 63 which should not be more negative than $-4\times10^{-4}$ mW/(mA)$^2$. The just-described slope line 63 has been described for a line with a negative slope. Alternatively, a line with a positive slope of approximately the same magnitude also is workable.

Figure 10:
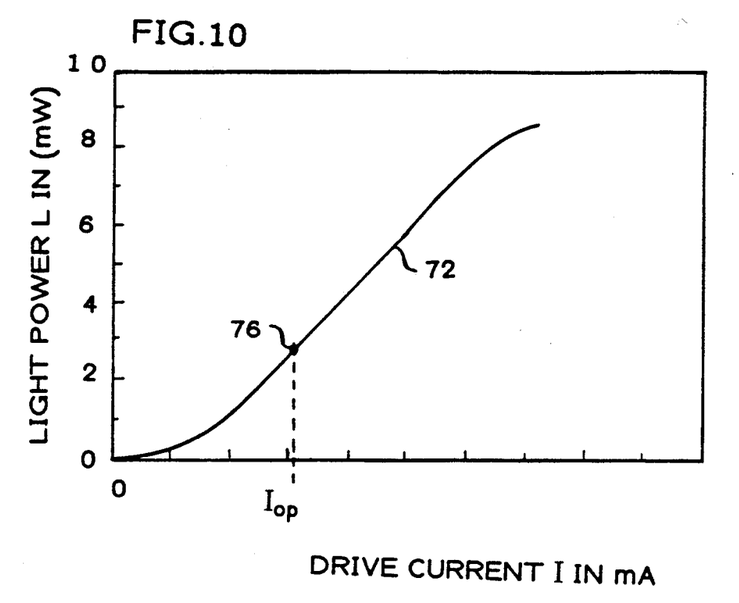
FIG. 10 is a light power versus drive current characteristic curve for a slow turn-on laser diode.
Figure 11:
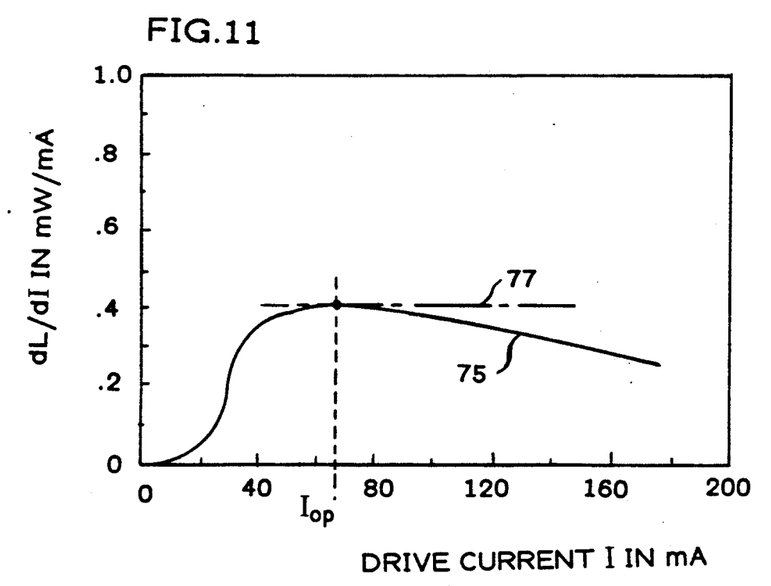
FIG. 11 is a derivative curve for the characteristic curve of FIG. 10.

FIGS. 10 and 11, respectively, present an output light power L versus total laser drive current I characteristic curve 72 and its light power derivative dL/dI curve 75. These curves 72 and 75 represent the performance of the laser diode 40 of FIG. 3 for a slow turn-on device. It is noted that the light power derivative curve 75 of FIG. 11 has a broad peak region. When the point at the maximum value of the derivative curve 75 of FIG. 11 is determined, the corresponding drive current $I_{op}$ is used for determining an operating point 76 for the device 40 on the curve 72. It is a special case for the multi-channel television multiplexing arrangement of FIG. 1. When the slow turn-on laser diode, characterized by the curves 72 and 75, is operated at operating point current $I_{op}$, a tangent to the derivative curve 75 at the operating point current $I_{op}$ is a horizontal line 77. This represents the maximum of the light power derivative and is at a point of inflection in light power curve 72. Second-order distortion is very small at this operating point since the slope of the derivative curve 75 is zero. Operating at the point 76 is advantageous when a very low leakage current device is not available. For lasers with otherwise unacceptable leakage current levels, the superlinearity of the slow turn-on cancels the sub-linearity caused by current leakage and results in distortions within the target specifications.

Lasers have been selected for a multi-channel amplitude-modulated vestigial-sideband CATV system based upon the linearity criteria just described. However, when those lasers are installed in the multi-channel multiplexing system, the operating bias current $I_f$ is selected based upon both the carrier-to-noise ratio and the distortion products. For example, in any given channel the carrier-to-noise ratio is set to the desired value (e.g., in a loop transmission system, a carrier-to-noise ratio of approximately 48 dB and a composite second-order and a composite triple beat of approximately 57 dBc are used; for a trunk transmission system, carrier-to-noise ratios of approximately 50–51 dB, a composite second order of approximately 55–60 dBc, and a composite triple beat of approximately 60–65 dBc are used) by increasing the modulation depth and then optimizing the laser drive current to minimize the distortion products. The optimized laser drive current $I_f$ for best system operation generally is within several milliamps of the device drive current $I_{op}$ discussed hereinbefore in regard to the device selection process.

Operation of the multi-channel multiplexing system of FIG. 1 has been described for high linearity laser diodes. The laser diodes have sufficient linearity because of very low leakage current and/or because the laser diode is operated at a point of inflection in its output light power L versus total drive current characteristic curve.

The system described herein together with other systems made obvious in view thereof are covered by the appended claims.

We claim:

1. A sub-carrier multiplex transmission system comprising
means for frequency division multiplexing a plurality of channels into a multiplexed input signal;
means for supplying a dc bias current;
means for combining said dc bias current and the multiplexed input signal into a laser drive current; and a semiconductor laser, responsive to the laser drive current, for producing an optical output including the plurality of channels and their second-order and third-order distortion signals, the dc bias current being a current for which a first derivative of laser power with respect to laser drive current is approximately a maximum.

2. The sub-carrier multiplex transmission system, in accordance with claim 1, wherein the channels are a plurality of television channels throughout a range of frequencies from 1 MHz to 1 GHz.

3. A sub-carrier multiplex transmission system comprising means for frequency division multiplexing a plurality of channels into a multiplexed input signal;

means for supplying a dc bias current;

means for combining said dc bias current and the multiplexed input signal into a laser drive current; and a semiconductor laser, responsive to the laser drive current, for producing an optical output including the plurality of channels and their second-order and third-order distortion signals, the dc bias current being a current for which a line tangent at said current to a curve of first derivative of laser output power with respect to laser drive current has a slope with a magnitude less than or equal to approximately $4 \times 10^{-4}$ mW/mA$^2$.

4. The sub-carrier multiplex transmission system as defined in claim 3 wherein the plurality of channels corresponds to a plurality of television channels spanning a range of frequencies from 1 MHz to 1 GHz.

5. A sub-carrier multiplex transmission system comprising means for frequency division multiplexing a plurality of channels into a multiplexed input signal;

means for supplying a dc bias current;

means for combining said dc bias current and the multiplexed input signal into a laser drive current; and a semiconductor laser, responsive to the laser drive current, for producing an optical output including the plurality of channels and their second-order and third-order distortion signals, the dc bias current to the semiconductor laser being greater than a threshold current and sufficient to cause an intercept current to be at least 500 mA greater than the threshold current so that composite distortion products in the optical output are approximately minimized, wherein the intercept current is the current for which a line tangent to a dL/dI versus current characteristic for the semiconductor laser intercepts a point at which dL/dI is approximately zero.

6. The sub-carrier multiplex transmission system as defined in claim 5 wherein the plurality of channels corresponds to a plurality of television channels spanning a range of frequencies from 1 MHz to 1 GHz.

* * * * *